United States Patent [19]

Chao et al.

[11] Patent Number: 5,356,527
[45] Date of Patent: Oct. 18, 1994

[54] METHOD FOR RINSING COPPER OR COPPER BASE ALLOY FOIL AFTER AN ANTI-TARNISH TREATMENT

[75] Inventors: Chung-Yao Chao; Lifun Lin, both of Waltham, Mass.

[73] Assignee: Olin Corporation, New Haven, Conn.

[21] Appl. No.: 746,006

[22] Filed: Aug. 9, 1991

Related U.S. Application Data

[63] Continuation of Ser. No. 548,314, Jul. 2, 1990, abandoned.

[51] Int. Cl.$^5$ .............................................. C25D 5/48
[52] U.S. Cl. ...................................... 205/155; 205/156; 205/220
[58] Field of Search ................. 205/155, 156, 220, 138

[56] References Cited

U.S. PATENT DOCUMENTS

| | | | |
|---|---|---|---|
| 2,030,601 | 2/1936 | McDonald | 148/6.5 |
| 2,412,543 | 12/1946 | Tanner | 204/35 |
| 2,418,608 | 4/1947 | Thompson et al. | 148/6 |
| 2,647,865 | 8/1953 | Freud | 204/33 |
| 3,625,844 | 12/1971 | McKean | 204/140 |
| 3,677,828 | 7/1972 | Caule | 148/6.15 R |
| 3,716,427 | 2/1973 | Caule | 156/3 |
| 3,764,400 | 10/1973 | Caule | 146/6.16 |
| 3,853,716 | 12/1974 | Yates et al. | 204/28 |
| 3,940,303 | 2/1976 | Caule | 148/269 |
| 4,131,517 | 12/1978 | Mitsuo et al. | 204/27 |
| 4,387,006 | 6/1983 | Kajiwara et al. | 204/32 R |
| 4,432,846 | 2/1984 | Honeycutt, III | 204/129.95 |
| 4,468,293 | 8/1984 | Polan et al. | 204/27 |
| 4,515,671 | 5/1985 | Polan et al. | 204/228 |
| 4,647,315 | 3/1987 | Parthasarathi et al. | 148/6.16 |
| 4,952,285 | 8/1990 | Lin et al. | 204/27 |

FOREIGN PATENT DOCUMENTS

A2073779 10/1981 United Kingdom .
A2030176 4/1988 United Kingdom .

*Primary Examiner*—John Niebling
*Assistant Examiner*—Kishor Mayekar
*Attorney, Agent, or Firm*—Gregory S. Rosenblatt

[57] ABSTRACT

The present invention relates to a technique for improving the tarnish and oxidation resistance of copper and copper based alloy materials. A chromium-zinc coating is electrolytically applied to copper or copper based alloy surface using a caustic electrolyte solution. The coated material is then rinsed in an aqueous solution containing a phosphate salt of alkali metals or alkaline earth metals, or a borate salt of alkali metals or alkaline earth metals. The pH of the rinse solution is maintained from about 5 to about 12 and preferably from about 7 to about 10.

15 Claims, 1 Drawing Sheet

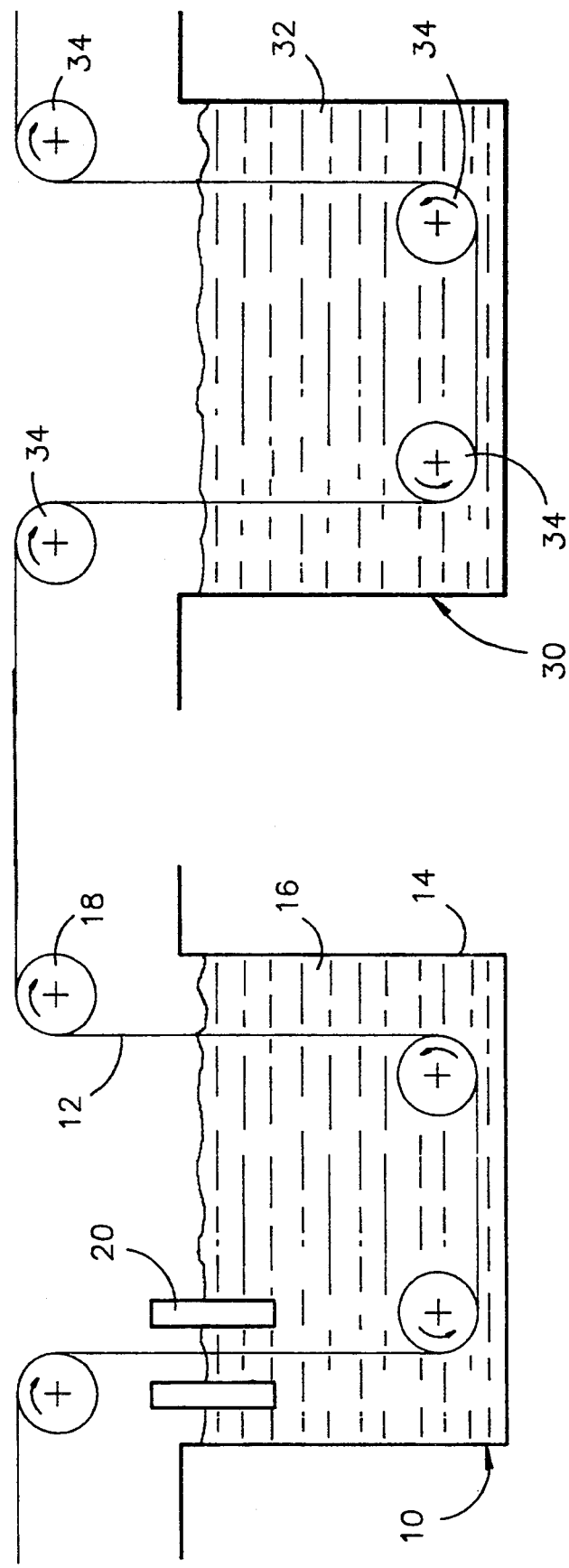

METHOD FOR RINSING COPPER OR COPPER BASE ALLOY FOIL AFTER AN ANTI-TARNISH TREATMENT

This application is a continuation of application Ser. No. 07/548,314, filed Jul. 2, 1990, now abandoned.

BACKGROUND OF THE INVENTION

1. Field of the Invention

The present invention broadly relates to a method for treating copper and copper base alloy materials to form a tarnish and oxidation resistant film. More particularly, the invention relates to a rinse treatment to be used after an anti-tarnish film is deposited on a copper or copper base alloy foil art and has particular application when a chromium-zinc anti-tarnish film is deposited on such foil.

2. Background Information

Copper and copper base alloy foils are widely used in the printed circuit board industry. The foil is produced to a thickness of under 0.006 inches and more generally to a thickness in the range of from about 0.0002 inches (known in the art as $\frac{1}{8}$ ounce foil) to about 0.0028 inches (known in the art as 2 oz. copper foil). The foil is produced by one of two means. "Wrought" foil is produced by mechanically reducing the thickness of a copper or copper alloy strip by a process such as rolling. "Electrodeposited" foil is produced by electrolytically depositing copper ions on a rotating cathode drum and then peeling the deposited strip from the cathode.

The foil is then bonded to a dielectric support layer forming a printed circuit board. The dielectric support layer is typically a polyimide such as Kapton manufactured by Dupont or FR-4 (a fire retardant epoxy). The copper foil layer is laminated to the dielectric carrier layer. Lamination comprises bonding the copper foil layer to the dielectric carrier layer through the use of heat and pressure. A pressure of about 300 psi, at a temperature at about 175° for a time of up to 30 minutes will provide suitable adhesion between the layers.

To maximize adhesion, it is desirable to roughen the surface of the foil which contacts the dielectric prior to bonding. While there are a variety of techniques available to roughen or treat the foil, one exemplary technique involves the formation of a plurality of copper or copper oxide dendrites on the foil surface. U.S. Pat. Nos. 4,468,293 and 4,515,671, both to Polan et al disclose this treatment. The process produces COPPERBOND TM foil (COPPERBOND TM is a trademark of Olin Corporation, Stamford, Conn.).

One problem facing printed circuit board manufacturers using either electrolytic or wrought copper foils is the relative reactivity of the copper. Copper readily stains and tarnishes. Tarnishing may occur during room temperature storage of the foil or during elevated temperature lamination. The stains and tarnish are aesthetically unpleasant and may be a source of problems during the manufacture of the printed circuit board. For example, staining of copper foil prior to lamination can affect both the bond strength between the foil and the dielectric substrate and the etching characteristics of the resultant laminate.

In the past, stain resistance has been imparted to copper and copper base alloy materials by immersion in an electrolyte containing chromate ions. U.S. Pat. No. 3,625,844 to McKean, describes a method of stainproofing copper foil involving the electrolytic treatment of the foil in an aqueous electrolyte under critical conditions of hexavalent chromium ion concentration, cathode current density, and treatment time.

U.S. Pat. No. 3,853,716 to Yates et al, discusses the McKean process and points out that it is not a completely satisfactory stain-proofing technique, due to a build-up of copper and chromium cations in the electrolyte bath. The cations interfere with the effectiveness of the stain proofing. Yates et al attempt to overcome this problem by rendering the copper material cathodic as it passes through an aqueous electrolyte containing hexavalent chromium ion containing anions and being of sufficient alkalinity to cause precipitation of copper and chromium cations.

U.S. Pat. Nos. 4,131,517 to Mitsuo et al, and 4,387,006 to Kajiwara et al, illustrate still other chromate containing treatments for suppressing time dependent changes in color tone during storage. Still other stain proofing techniques are illustrated in United Kingdom published patent applications 2,030,176A and 2,073,779A.

Solutions of phosphoric acid, chromic acid and/or their salts have also been applied to various materials in an attempt to impart tarnish and corrosion resistance. U.S. Pat. Nos. 3,677,828, 3,716,427 and 3,764,400, all to Caule, illustrate the use of phosphoric acid solutions to improve the tarnish resistance of copper and copper-based alloys. Caule also describes in his '400 patent the use of a caustic rinse solution after application of his phosphoric acid treatment. U.S. Pat. No. 4,647,315 to Parthasarathi et al discloses a dilute aqueous chromic acid-phosphoric acid solution followed by a caustic rinse. Such caustic solutions may have a pH of at least 8 and may include addition agents selected from the group consisting of the salts of alkali metals, the salts of the alkaline earth metals, the hydroxides of the alkali metals, and the hydroxides of the alkaline earth metals.

Phosphoric and/or chromic acid solutions have also been applied to zinc, zinc-coated articles and aluminum foil and articles. U.S. Pat. No. 2,030,601 to McDonald, U.S. Pat. No. 2,412,532 to Tanner, U.S. Pat. No. 2,418,608 to Thompson et al, U.S. Pat. No. 2,647,865 to Freud and U.S. Pat. No. 4,432,846 to Honnycutt, III illustrate some of the applications of phosphoric-chromic acid solution.

Following lamination, the anti-tarnish coating must be removed so the underlying copper foil may be etched into a desired circuit pattern. Circuit traces are patterned into the copper foil by photolithography as known in the art. The unbonded side of the copper foil is coated with a photo-sensitive chemical resist. The resist is exposed to a developer such as ultraviolet light exposed through a mask containing the desired circuit pattern. Dependent on whether the photoresist is that known in the art as "positive" resist or "negative" resist, the image may be either a desired circuit pattern, or the negative image. After exposure, the unexposed portion of the photoresist is removed by rinsing with an appropriate solvent to expose the underlying foil. The circuit board is then immersed in a suitable etchant to remove the exposed copper. After etching and rinsing, the remaining photoresist is removed by a solvent wash. The dielectric substrate is unaffected by the solvent and etchant. The substrate remains intact and the copper foil layer is patterned into a desired configuration of circuit traces.

If the anti-tarnish coating layer is not completely removed, it may interfere with the etching step during photolithography resulting in incomplete etching and the potential for an electrical short circuit. One chemical solution used to remove the anti-tarnish coating comprises 4% by volume, hydrochloric acid in water. Many of the prior art anti-tarnish coatings are not readily removed by the 4% HCl solution and require mechanical abrasion or other invasive techniques. Partial removal of the coating layer or an inordinately long process time may result.

While generally used as the etchant to remove the anti-tarnish coating from copper foil, hydrochloric acid is not desirable for environmental reasons. The chloride ions present are environmentally damaging. Regeneration of the ions into a reusable etchant or the safe disposal of the ions is an expensive proposition. A preferred solution would be to provide an anti-tarnish coating which is readily removed by a less harmful etchant.

It is known in the art that a chromium-zinc compound forms a satisfactory anti-tarnish coating for copper and copper base alloys. One such commercial coating has the composition 10 atomic % Zn; 5% Cr; 37% O; 46% C and 2% Cu. The coating is readily removed with a 4% HCl solution. However, the coating is not removable by other, more preferred etchants such as dilute 5% by weight $H_2SO_4$.

A treatment which provides satisfactory anti-tarnish resistance and is easily removable by common etchants such as HCl and $H_2SO_4$ involves providing an aqueous basic electrolytic solution containing hydroxide ions, from about 0.07 to about 7 grams per liter of zinc ions, and from about 0.1 to about 100 grams per liter of a water soluble hexavalent chromium compound. The operating temperature may be from room temperature up to about 100° C.

The copper or copper base alloy foil is immersed in the solution. A current density of from about 1 milliamp per square centimeter to about 1 amp per square centimeter is applied with the foil serving as the cathode. The foil remains in the electrolyte for a time sufficient to deposit a chromium-zinc coating layer having a thickness effective to prevent tarnish.

SUMMARY OF THE INVENTION

After deposition of the chromium-zinc compound, it is desirable to rinse the foil to remove the residual chemicals. Such rinse solution must be one which will not adversely effect the anti-tarnish resistance of the treated foil, is relatively inexpensive, and does not cause environmental problems.

In accordance with the present invention, an effective rinse solution has been found to be an aqueous buffer solution having a pH in the range of the solubility minimum of the anti-tarnish materials. Such an aqueous solution may contain phosphate salts of alkali metals or alkaline earth metals or borate salts of alkali metals or alkaline earth metals or mixtures thereof.

BRIEF DESCRIPTION OF THE DRAWINGS

FIG. 1 is a schematic representation of a system for treating foil in accordance with the present invention.

DETAILED DESCRIPTION

The FIGURE illustrates an electrolytic cell 10 for depositing an anti-tarnish coating on the surface of the copper or copper base alloy foil 12. The electrolytic cell 10 comprises a tank 14 which may be manufactured from any material which does not react with the electrolytic solution 16. An exemplary material for tank 14 is a polymer, such as polyethylene or polypropylene.

Guide rolls 18 control the travel of the foil strip 12 through the electrolytic cell 10. The guide rolls 18 are manufactured from any material which does not react with the electrolyte solution 16. Preferably, at least one of the guide rolls is formed from an electrically conductive material, such as stainless steel, so that a current may be impressed in the copper foil strip as detailed hereinbelow. Guide rolls 18 rotate at a controlled speed so that the foil strip 12 is positioned between anodes 20 for a required time as discussed hereinbelow.

The power source (not shown) is provided so that an electric current may pass from the anodes 20 to the foil strip (cathode) 12 by means of the electrolytic solution 16. In this way, an anti-tarnish coating with the desired composition and thickness is deposited on the foil strip 12.

The electrolytic solution of the invention consists essentially of a hydroxide source, zinc ion source and a water soluble hexavalent chromium. The hydroxide source is preferably sodium hydroxide or potassium hydroxide, and most preferably, sodium hydroxide (NaOH). The hexavalent chromium source may be any water soluble hexavalent chromium compound such as $Na_2Cr_2O_7 \cdot 2H_2O$.

In its broadest compositional range, the electrolyte solution 16 consists essentially of from about 5 to about 100 grams per liter of the hydroxide, from 0.07 to about 7 grams per liter of zinc ions supplied in the form of a water soluble zinc compound such as ZnO and from 0.1 to about 100 grams per liter of a water soluble hexavalent chromium salt. More preferably, the compositional range is from about 10 to about 50 grams per liter NaOH, from 0.2 to about 3 grams per liter zinc oxide and from about 0.2 to about 5 grams per liter sodium dichromate. In its most preferred embodiment, the electrolyte contains from about 10 to about 25 grams per liter NaOH, from about 0.2 to about 1.5 grams per liter ZnO and from about 0.2 to about 2 grams per liter sodium dichromate.

With each of the solutions described herein above, it is believed that an effective concentration of a surfactant such as lauryl sulfate will provide a more uniform surface.

The pH of the solution is maintained as basic. A pH in the range of from about 12 to 14 is preferred. The solution readily operates at all temperatures from room temperature up to about 100°. For maximum deposition rates, it is preferred to maintain the electrolyte temperature in the range of about 35° to about 65°.

The electrolyte solution operates well in a wide range of current densities. Successful coatings may be applied with a current density ranging from 1 milliamp per square centimeter up to about 1 amp per square centimeter. A more preferred current density is from about 3 $mA/cm^2$ to about 100 $mA/cm^2$. The actual current density employed is dependent on the time the foil strip 12 is exposed to the current. That is, the time the foil strip 12 is between the anodes 20 and immersed in electrolyte solution 16. Typically, this dwell time is from about 10 to about 25 seconds. During this dwell, an effective thickness of the anti-tarnish coating compound is deposited. The effective thickness is that capable of inhibiting copper tarnish at elevated temperatures of up to about 190° in air for about 30 minutes. The anti-tarnish coating should further be sufficiently thin to be easily removable with a 4% HCl etch solution or preferably a 5 wt. % $H_2SO_4$ etch solution. It is believed that an effective coating thickness is from less than 100 angstroms to about 0.1 microns. Successful results have been obtained with coating thicknesses as low as 40 angstrom and coating thicknesses of from about 10 angstroms to about 100 angstroms are preferred. The coating layer is sufficiently thin to appear transparent or impart a slight gray tinge to the copper foil.

The thickness of the coating layer applied by the electrodeposition has been determined by Auger Electron Spectroscopy. The technique employs an ion source to sputter away the surface of the sample at a controlled rate, for example, 10 angstroms per minute. The composition of the surface of ore material is analyzed before and after sputtering. A 50% copper level was considered to indicate the substrate had been reached. The thickness of the coating layer was determined to be about 40 angstroms as compared to about 80 angstroms for the commercially available material. The satisfactory properties of the anti-tarnish coating of the invention at 40 angstroms indicates a coating thickness in the range of about 10 angstroms to about 100 angstroms would be sufficient.

The anti-tarnish coating is applied to a copper or copper based alloy strip by electrolytic deposition. Smooth and shiny surfaces are easily coated. Electrolytic solutions containing a caustic component, zinc oxide and a hexavalent chromium salt in a broad range of compositions are acceptable.

Effective solutions to electrolytically deposit an anti-tarnish coating on a toughened copper or copper base alloy surface are more limited in composition. The dichromate concentration should be maintained below about 3 grams per liter.

The addition of an organic additive such as lauryl sulfate to the electrolyte is believed to improve the properties of the anti-tarnish coating. At 30 ppm lauryl sulfate, the oxidation resistance of the coating was found to extend to about 10° C. higher than a coating deposited from the same electrolyte without the additive. Other properties such as peel strength and acid removability were not affected. The effective composition of the surfactant is believed to be from about 10 ppm to about 50 ppm.

While not fully understood, the co-electrodeposited anti-tarnish layer is believed to be either an alloy of chromium and zinc or a partial hydroxide compound of those elements or mixtures of such alloys and compounds. Auger Electron Spectroscopy results have shown that the coating includes a higher weight percentage of zinc as compared to chromium.

The coated foil strip 12 exits from the electrolytic cell 10 and is then immersed in a rinse tank 30 containing the rinse solution 32. A plurality of guide rolls 34 may be used to define the path by which the foil tracts through the tank 30. The rinse solution 32 is an aqueous buffer solution having a pH close to the solubility minimum of the materials forming the anti-tarnish coating. This minimizes the dissolution of the anti-tarnish coating. In the case of the anti-tarnish treatment described above, chrome and zinc form the anti-tarnish treatment. The buffer solution should have a pH of from about 5 to about 12 and preferably a pH in the range of about 7 to about 10.

The buffer solution may include any buffer material forming a pH in the appropriate range. A suitable solution comprises an aqueous solution containing a material selected from the phosphate salts of alkali metals or alkaline earth metals or borate salts of alkali metals or alkaline earth metals. Suitable phosphate salts include dibasic or tribasic sodium/potassium phosphates such as $Na_2HPO_4/K_2HPO_4$ or $Na_3PO_4/K_3PO_4$.

Suitable borate salts include sodium tetraborate ($Na_2B_4O_7$) or a mixture of sodium tetraborate with boric acid ($H_3BO_4$).

Generally the salts will be present in a concentration of from about 10 to about 2,000 ppm (parts per million) and preferably from about 30 to about 500 ppm.

The temperature of the rinse solution may be maintained at a temperature in the range from about room temperature up to the boiling point of the solution. Preferably, the temperature is maintained in the range from about 40° C. to about 70° C. While the time of immersion in the rinse solution may vary from about 1 second to about 120 seconds, most preferably, it is immersed for about 5 seconds to about 30 seconds.

A small amount of an organic silane, such as $C_8H_{22}N_2O_3Si$, on the order of about 1 milliliter per liter may also be added to the rinse solution to maintain peel strength.

During the rinsing process, the pH of the rinse solution will eventually increase due to the drag-in of the high pH electrolyte solution 16. In such a case, the pH should be adjusted back to its original level by the addition of an additive such as an appropriate acid. In the case where the phosphate salts of alkali metals or alkaline earth metals are used, sulfuric acid or phosphoric acid may be used when the borate salts of alkali metals or alkaline earth metals are used, boric acid may be used.

After rinsing, the foil strip is dried by forced air. The air may be cool, that is at room temperature, or heated. Heated forced air is preferred since accelerated drying minimizes spotting of the foil.

The present invention will be more clearly understood by the examples which follow.

Wrought copper foil having one side roughened with dendritic copper by the COPPERBOND ™ process was coated with a chromium-zinc anti-tarnish treatment by immersion in an electrolyte solution containing 20 grams per liter NaOH, 1 gram per liter ZnO, 1 gram per liter $Na_2Cr_2O_7 \cdot 2H_2O$. A current density of 10 mA/cm$^2$ was impressed on the foil. Dwell time within the anodes was 10 seconds.

After coating, the foil was rinsed in various solutions containing 50–100 ppm $K_2HPO_4$, 50–100 ppm $K_3PO_4$, or 50–100 ppm $Na_2B_4O_7$ with the pH adjusted to 8 by the addition of $H_3BO_4$. The rinse solutions were maintained at temperatures of 40°, 50°, 60° and 70° C. and the time of immersion was between 20–30 seconds. The treated foil was tested for tarnish resistance. A simulated printed circuit board lamination thermal cycle was employed. The simulation comprised a 30 minute air bake at 190° C. No discoloration was observed on the area where the anti-tarnish treatment was applied after exposure to the air bake. The anti-tarnish film was easily removed from the copper foil with 4% HCl or 5% $H_2SO_4$. Similar foil which was either not treated with the chromium-zinc anti-tarnish treatment or had been anti-tarnish treated, but rinsed in deionized water had severe discoloration. The deionized water rinse did not prevent the treated copper foil from discoloration because the water does not have pH buffering properties. The anti-tarnish film was easily removed from the copper foil with 4% HCl or 5% $H_2SO_4$.

While the use of the aqueous buffer solution was described above in connection with the electrolyte deposition of a chrome/zinc anti-tarnish coating, it is thought applicable to anti-tarnish treatment in general, and specifically to chrome/zinc coating applied by other methods such as zinc plating followed by immersion in chromic acid or immersion of the foil in a chromic acid/phosphoric acid bath followed by another immersion in zinc oxide/sodium hydroxide.

The patents cited in this application are intended to be incorporated by reference.

It is apparent that there has been provided in accordance with this invention a rinse solution for use after a chromium-zinc anti-tarnish coating has been deposited on copper or a copper based alloy foil using a caustic electrolyte which fully satisfy the objects, means, and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A method for treating a copper or copper base alloy foil to impart tarnish resistance thereto, comprising the steps of:
    electrolytically depositing chromium and zinc ions on said foil strip, thereafter
    rinsing said foil in an aqueous buffer solution containing a material selected from the group consisting of the phosphate salts of an alkali metal or alkaline earth metal, the borate salts of an alkali metal or alkaline earth metal, or mixtures thereof, said solution having a pH from about 5 to about 12, and
    maintaining the pH of said solution by adding an acid to said solution during processing.

2. The method of claim 1 wherein the pH of said rinse solution is maintained at from about 5 to about 12.

3. The method of claim 1 wherein:
    said electrolytically depositing includes providing an electrolyte comprising an aqueous basic solution containing hydroxide ions, from about 0.07 grams per liter to about 7 grams per liter zinc ions, and from about 0.1 grams per liter to about 100 grams per liter of a water soluble hexavalent chromium salt;
    immersing said foil strip in said electrolyte;
    passing current through said strip and electrolyte such that a current density of from about 1 milliamp per square centimeter to about 1 amp per square centimeter is provided and;
    electrolytically depositing a chromium-zinc coating on said foil for a time sufficient to deposit a coating having a thickness effective to prevent tarnishing.

4. The method of claim 3 wherein the composition of said electrolyte consists essentially of from about 10 to about 50 grams per liter NaOH, from about 0.2 to about 3 grams per liter ZnO, and from about 0.2 to about 5 grams per liter $Na_2Cr_2O_7 \cdot 2H_2O$.

5. The method of claim 4 wherein the composition of said electrolyte consists essentially of from about 10 to about 25 grams per liter NaOH, from about 0.2 to about 1.5 grams per liter ZnO, and from about 0.2 to about 2 grams per liter $Na_2Cr_2O_7 \cdot 2H_2O$.

6. The method of claim 5 wherein said solution further includes an effective concentration of a surfactant.

7. The method of claim 5 wherein said surfactant is lauryl sulfate.

8. The method of claim 7 wherein the pH of said solution is from about 12 to 14.

9. The method of claim 8 wherein current density for said electrolytic deposition step is from about 3 to about 100 $mA/cm^2$.

10. The method of claim 9 wherein the effective thickness of said electrolytically deposited anti-tarnish coating is from less than a hundred angstroms to about 0.1 micron.

11. The method of claim 1 wherein said aqueous rinse solution contains from about 10 to about 2,000 ppm of a material selected from the group consisting of sodium/-potassium phosphate, sodium tetraborate, or sodium tetraborate with boric acid or mixtures thereof.

12. The method of claim 1 wherein the concentration of said material in said aqueous rinse solution is from about 30 parts per million to about 500 parts per million.

13. The method of claim 1 wherein said acid comprises sulfuric acid or phosphoric acid for phosphate salts and boric acid for borate salts.

14. The method of claim 1 wherein said rinse solution further contains about 1 milliliter per liter silane.

15. The method of claim 1 wherein the temperature of said rinse solution is between 40° and 70° C.

* * * * *